(12) United States Patent
Karmous (10) Patent No.: US 10,608,099 B2
(45) Date of Patent: Mar. 31, 2020

(54) METHODS OF MANUFACTURING SEMICONDUCTOR DEVICES WITH A DEEP BARRIER LAYER

(71) Applicant: Infineon Technologies Austria AG, Villach (AT)

(72) Inventor: Alim Karmous, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/948,289

(22) Filed: Apr. 9, 2018

(65) Prior Publication Data

US 2019/0312127 A1    Oct. 10, 2019

(51) Int. Cl.
| | |
|---|---|
| *H01L 21/324* | (2006.01) |
| *H01L 29/66* | (2006.01) |
| *H01L 29/739* | (2006.01) |
| *H01L 29/78* | (2006.01) |
| *H01L 21/308* | (2006.01) |
| *H01L 21/265* | (2006.01) |
| *H01L 29/10* | (2006.01) |

(52) U.S. Cl.
CPC .. *H01L 29/66348* (2013.01); *H01L 21/26513* (2013.01); *H01L 21/308* (2013.01); *H01L 21/324* (2013.01); *H01L 29/1095* (2013.01); *H01L 29/7395* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 7,465,642 | B2 * | 12/2008 | Cheng | H01L 29/66181 438/526 |
| 7,851,349 | B2 * | 12/2010 | Rieger | H01L 29/66348 438/620 |
| 9,209,276 | B2 * | 12/2015 | Nakamura | H01L 29/66848 |
| 9,245,986 | B2 * | 1/2016 | Song | H01L 29/66348 |

* cited by examiner

*Primary Examiner* — Chandra Chaudhari
(74) *Attorney, Agent, or Firm* — Murphy, Bilak & Homiller, PLLC (57) ABSTRACT

A method of manufacturing a semiconductor device includes: etching a plurality of trenches to a first depth in a semiconductor substrate; doping a region of the semiconductor substrate surrounding a bottom of the trenches at the first depth to form a doped region in the semiconductor substrate; after the doped region is formed, etching the plurality of trenches deeper into the semiconductor substrate to a second depth greater than the first depth, adjacent ones of the trenches being separated from one another by a semiconductor mesa; and forming a body region above the doped region in the semiconductor mesas.

19 Claims, 9 Drawing Sheets

METHODS OF MANUFACTURING SEMICONDUCTOR DEVICES WITH A DEEP BARRIER LAYER

BACKGROUND

An IGBT (insulated gate bipolar transistor) with high emitter side charge carrier density has low on-state voltage drop (VCEON) and low switching-off losses, since at turn off most charge carriers are removed at low collector-to-emitter voltages (VCE). High emitter side charge carrier density can be achieved using trench cell geometry and/or by forming a potential barrier within the drift zone of the IGBT device (e.g. an n-type hole potential barrier for an npnp IGBT with n-type drift zone and p-type body). The barrier layer is typically formed by an implantation and annealing process performed before the gate trenches are formed. The depth of the barrier layer within the drift zone is limited by the implantation energy, implantation dose, implantation profile and subsequent diffusion processes. Also, the height of the body region may be reduced if the potential barrier layer is formed too shallow in the drift zone and/or if the implantation dose is too high and diffusion processes are too long. A reduced-height body region results in a shorter channel region, which can induce short channel effects such as high off-state leakage current, impact ionization, velocity saturation/mobility degradation, punch through, channel length modulation, etc. Hence, there is a need for semiconductor devices with improved barrier layers and corresponding methods of manufacture.

SUMMARY

According to an embodiment of a method of manufacturing a semiconductor device, the method comprises: etching a plurality of trenches to a first depth in a semiconductor substrate; doping a region of the semiconductor substrate surrounding a bottom of the trenches at the first depth to form a doped region in the semiconductor substrate; after the doped region is formed, etching the plurality of trenches deeper into the semiconductor substrate to a second depth greater than the first depth, adjacent ones of the trenches being separated from one another by a semiconductor mesa; and forming a body region above the doped region in the semiconductor mesas.

According to an embodiment of a semiconductor device, the semiconductor device comprises: a semiconductor substrate having a first main surface; a plurality of trenches extending from the first main surface into the semiconductor substrate; semiconductor mesas disposed between adjacent ones of the trenches; a hole or electron potential barrier formed in the semiconductor mesas; and a body region formed above the hole or electron potential barrier in the semiconductor mesas. The hole or electron potential barrier has a peak doping concentration of at least 5 E16 cm$^{-3}$.

According to another embodiment of a method of manufacturing a semiconductor device, the method comprises: etching a trench to a first depth in a semiconductor substrate; doping a region of the semiconductor substrate surrounding a bottom of the trench at the first depth to form an n-type hole potential barrier; and after the n-type hole potential barrier is formed, etching the trench deeper into the semiconductor substrate to a second depth greater than the first depth.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

Embodiments described herein provide for the formation of a deep doped region such as a hole or electron potential barrier deep enough in the drift zone of a power semiconductor device such as a power MOSFET or IGBT to avoid impacting the height of the body region and inducing related short channel effects. The deep doped region is formed during the gate trench formation process, so that the potential barrier may be formed deep enough in the drift zone and not impact the body region. The gate trench formation process is completed after the deep doped region is formed. In addition to avoiding short channel effects associated with a reduced-height body region, the approaches described herein also allow for a higher potential barrier doping which may reduce VCEON. In the case of forming the deep doped region by ion implantation, the depth of the potential barrier is not limited by implantation energy and less implantation damage occurs compared to conventional approaches. Even if the dopants used to form the deep doped region are implanted with low energy, most of the implanted area is removed during a subsequent part of the gate trench formation process.

Figure 1:
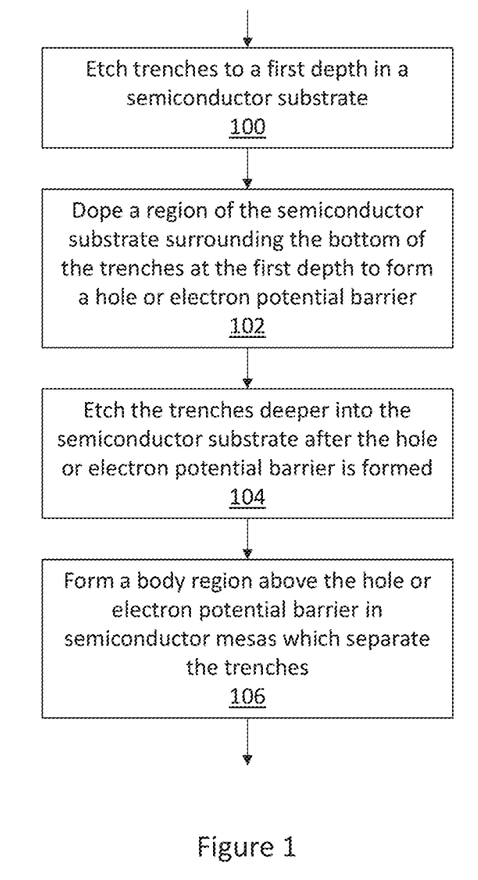
FIG. 1 illustrates a flow diagram of an embodiment of a method of manufacturing a semiconductor device having a deep doped region such as a hole or electron potential barrier.

FIG. 1 illustrates an embodiment of a method of manufacturing a semiconductor device such as a power MOSFET or IGBT. The method includes etching a plurality of gate trenches to a first (intermediary) depth in a semiconductor substrate (Block 100). Any standard semiconductor substrate and trench etching process may be used. A region of the semiconductor substrate surrounding the bottom of the gate trenches at the first depth is then doped to form a deep doped region in the semiconductor substrate (Block 102).

In one embodiment, the deep doped region is a hole potential barrier i.e. a potential energy barrier which is due to a higher valence band edge energy in the deep doped region than in the neighboring region from which holes are flowing. In another embodiment, the deep doped region is an electron potential barrier i.e. a potential energy barrier which is due to a higher conduction band edge energy in the deep doped region than in the neighboring region from which electrons are flowing. Whether the potential barrier is a hole or electron potential barrier may depend on the type of semiconductor device being manufactured. For example, in the case of an IGBT, the potential barrier may be a hole potential barrier or an electron potential barrier. In the case of a MOSFET, the potential barrier may be an electron potential barrier. In yet other embodiments, the deep doped region is formed deep in the semiconductor substrate but does not have a barrier function, For example, in the case of a MOSFET, the deep doped region may be used for reducing the electrical resistance of the mesa below the body region.

After the deep doped region is formed, the gate trench formation process continues by etching the gate trenches deeper into the semiconductor substrate to a second (final) depth greater than the first (intermediary) depth (Block 104). Adjacent ones of the gate trenches are separated from one another by a semiconductor mesa, and the deep doped region may or may not terminate within each semiconductor mesa before reaching the second (final) depth. The body region of the semiconductor device is formed above the deep doped region in the semiconductor mesas (Block 106). The body region may have the same or opposite conductivity type as the deep doped region, as explained above. The body region may be formed before or after formation of the deep doped region.

FIGS. 2A through 2E illustrate an embodiment of the method illustrated in FIG. 1. FIGS. 2A through 2E are partial cross-sectional views, with emphasis placed on the potential barrier formation process. Some structures and regions of the semiconductor device are omitted from FIGS. 2A through 2E for ease of illustration and understanding.

Figure 2A:
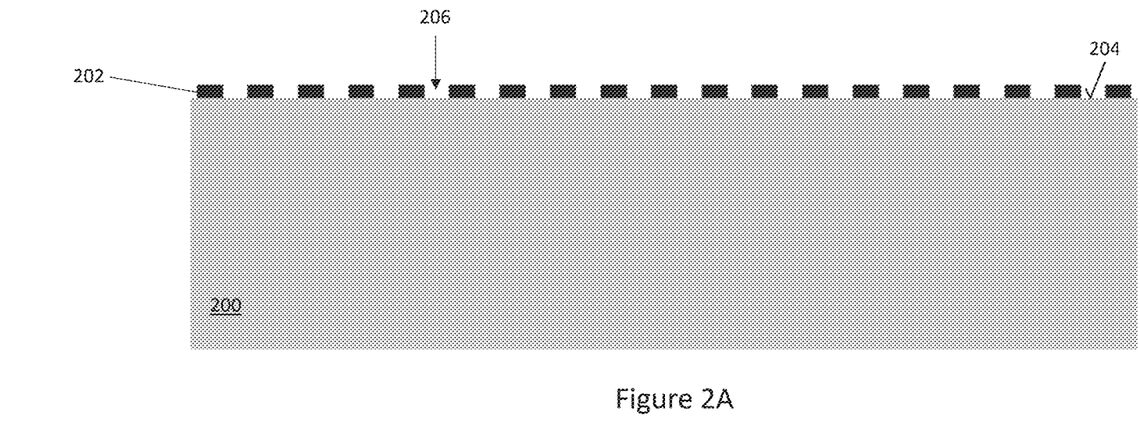
FIGS. 2A through 2E illustrate respective partial cross-sectional views of a semiconductor substrate during different stages of the method shown in FIG. 1.

FIG. 2A shows a semiconductor substrate 200 with a structured trench etch hard mask 202 formed on a first main surface 204 of the semiconductor substrate 200. Any standard semiconductor substrate and trench etch hard mask may be used. For example, the semiconductor substrate 200 may comprise any type of semiconductor material such as a single element semiconductor (e.g. Si, Ge, etc.), silicon-on-insulator, a binary semiconductor (e.g. SiC, GaN, GaAs, etc.), a ternary semiconductor, etc. with or without epitaxial layer(s). The trench etch hard mask 202 may be formed, e.g., using a deposition method and/or by thermal oxidation. The trench etch hard mask 202 may be formed of a layer or stack of layers designed to withstand the subsequent gate trench etching process. For example, the trench etch hard mask 202 may comprise a silicon oxide layer, a silicon nitride layer, a layer stack comprising silicon oxide/silicon nitride/silicon oxide stack, etc. The trench etch hard mask 202 may be structured using any standard hard mask etching process such as lithography. The structured trench etch hard mask 202 has openings 206 which define gate trench locations in the semiconductor substrate 200.

Figure 2B:
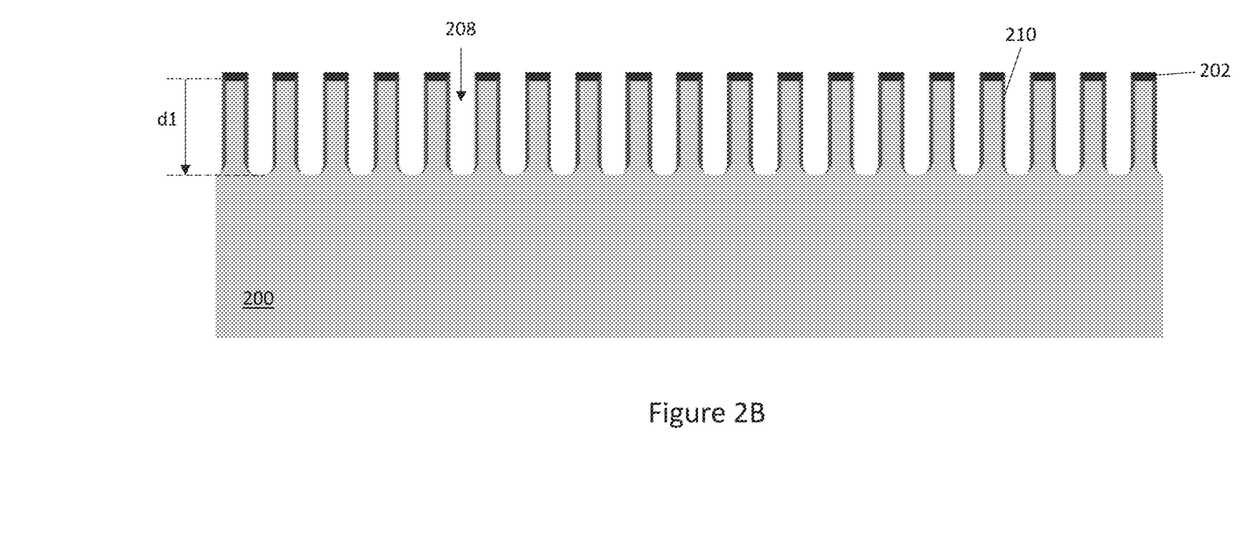

FIG. 2B shows the semiconductor substrate 200 after gate trenches 208 are etched to a first (intermediary) depth d1 in the semiconductor substrate 200 from the first main surface 204 through the openings 206 in the structured trench etch hard mask 202. Any standard trench etch process may be used such as anisotropic wet etching, plasma etching, etc. The first depth d1 is an intermediary depth in that the depth of the gate trenches 208 will be increased later in the process. The first (intermediary) depth d1 is selected so that the doped region is formed deep enough in the semiconductor substrate 200 to avoid impacting the height of the body region and inducing related short channel effects. Depth d1 depends on the device geometry and subsequent thermal budget. For example, in an IGBT with 5 µm final trench depth, d1 may be chosen to be around 3 µm. This is a purely illustrative example and should not be considered limiting.

FIG. 2B also shows the semiconductor substrate 200 after a protection layer or stack of protection layers 210 is formed on sidewalls and the bottom of the gate trenches 208 at the first (intermediary) depth d1. In one embodiment, the protection layer or stack of protection layers 210 is a silicon oxide layer. In another embodiment, the protection layer or stack of protection layers 210 is a silicon nitride layer. In yet another embodiment, the protection layer or stack of protection layers 210 is a stack of one or more silicon oxide layers and one or more silicon nitride layers. Still other types of protection layer or stack of protection layers may be formed on the sidewalls and the bottom of the gate trenches 208 at the first (intermediary) depth d1. The protection layer or stack of protection layers 210 may be formed using any standard process such as a deposition method and/or thermal oxidation. The protection layer or stack of protection layers 210 may be chosen different (e.g. in quality and/or composition) from the trench etch hard mask 202 to ensure its later elective removal with respect to the trench etch hard mask 202. The protection layer or stack of protection layers 210 protects at least the sidewalls of the gate trenches 208 during formation of the doped region.

According to one embodiment, the protection layer or stack of protection layers 210 is removed from the bottom of the gate trenches at the first (intermediary) depth d1 to expose the trench bottoms as shown in FIG. 2B. Any standard removal process such as anisotropic wet etching, plasma etching, etc. may be used to remove the protection layer or stack of protection layers 210 from the bottom of the gate trenches 208 at the first (intermediary) depth d1.

Figure 2C:
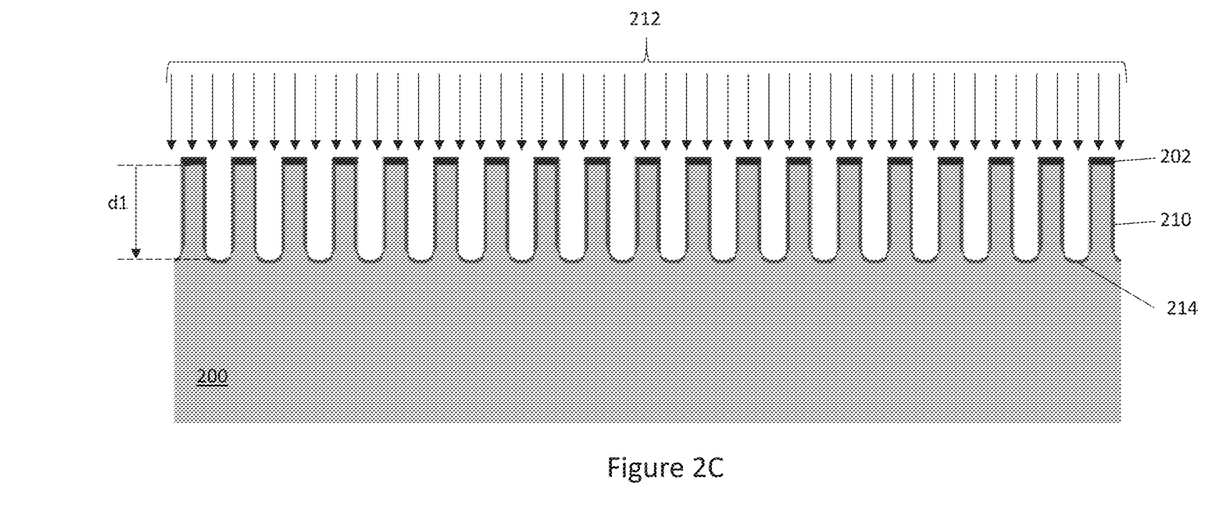

FIG. 2C shows the semiconductor substrate 200 during an implantation process used to form the doped region. A suitable dopant species 212 is implanted into the exposed trench bottoms to form implanted regions 214 in the semiconductor substrate 200 at the first (intermediary) depth d1. The type of dopant species depends on the type of semiconductor substrate 200 and whether the doped region being formed is a hole potential barrier, an electron potential barrier or has no potential barrier function. For example, in the case of a Si substrate and a hole potential barrier, pentavalent impurity atoms with 5 valence electrons such as antimony, arsenic and/or phosphorous may be implanted into the exposed trench bottoms. In the case of a Si substrate and an electron potential barrier, trivalent impurity atoms with 3 valence electrons such as boron, aluminum and/or gallium may be implanted into the exposed trench bottoms. In the case of a GaN substrate and a hole potential barrier, atoms such as silicon and/or germanium may be implanted into the exposed trench bottoms. In the case of a GaN substrate and an electron potential barrier, atoms such as magnesium may be implanted into the exposed trench bottoms. In the case of a SiC substrate and a hole potential barrier, atoms such as phosphorous and/or nitrogen may be implanted into the exposed trench bottoms. In the case of a SiC substrate and an electron potential barrier, atoms such as aluminum and/or boron may be implanted into the exposed trench bottoms. Still other substrate and dopant types are contemplated and within the scope of the embodiments described herein. In each case, the gate trenches 208 extend to an intermediary (first) depth d1 during the implantation process. The intermediary depth d1 defines the position of the doped region in the semiconductor substrate 200. Hence, the depth of the potential barrier region is not necessarily limited by implantation energy since the dopant species 212 is implanted into the bottom of the partly formed gate trenches 208 at a predetermined, controlled depth d1.

Figure 2D:
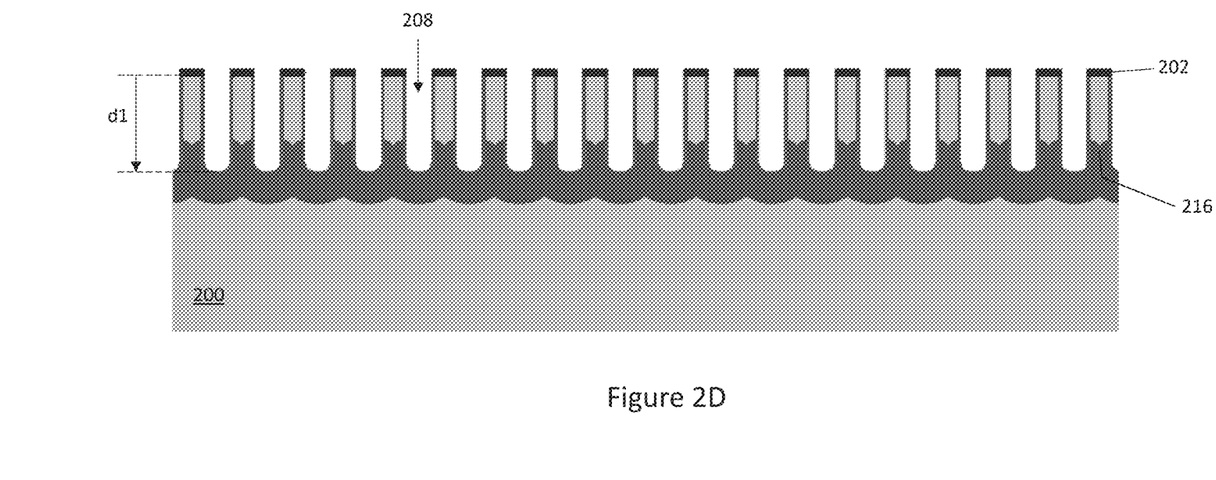

FIG. 2D shows the semiconductor substrate 200 after dopant diffusion and activation to form the doped region 216. The semiconductor substrate 200 may be annealed at an elevated temperature for a duration of time so that the implanted dopants move onto and occupy lattice sites within the semiconductor substrate 200. Any standard annealing process can be used to diffuse and activate the implanted dopants and form the doped region 216. The temperature and duration of the annealing process may depend on several variables, including the type of semiconductor substrate 200, the type of implanted dopants 212 and the profile of the doped region 216 formed in the semiconductor substrate 200. For example, diffusion temperatures for Si typically range from 900° C. to 1100° C. and diffusion time from a few minutes to a few hours. This is a purely illustrative example limited to Si technology and should not be considered limiting.

Figure 2E:
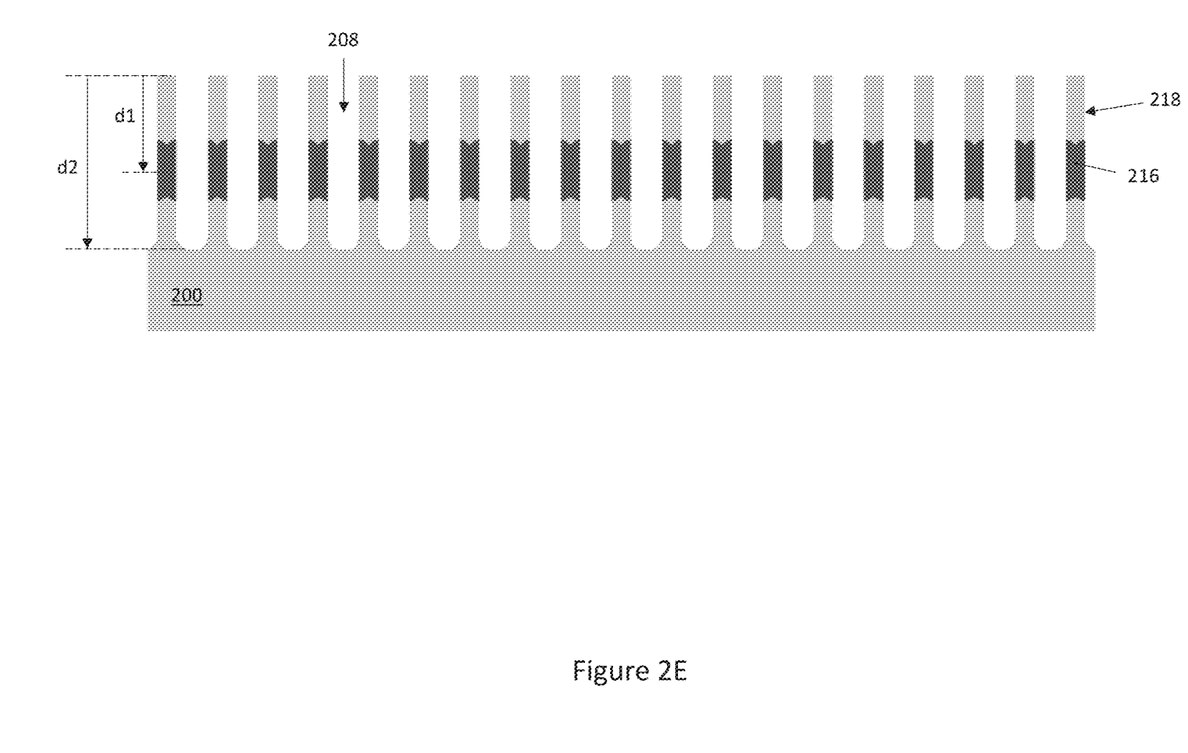

FIG. 2E shows the semiconductor substrate 200 after the gate trenches 208 are etched deeper into the semiconductor substrate 200 to a second (final) depth d2 greater than the first (intermediary) depth d1. Any standard trench etch process may be used such as anisotropic wet etching, plasma etching, etc. to extend the depth of the gate trenches 208. Adjacent ones of the gate trenches 208 are separated from one another by a semiconductor mesa 218. The doped region 216 may or may not terminate within each semiconductor mesa 218 before reaching the second (final) depth d2 of the gate trenches 208. Most of the damage to the semiconductor substrate 200 caused by the ion implantation process illustrated in FIG. 2C occurs around depth d1 at the bottom of gate trenches 208. By etching the gate trenches 208 deeper into the semiconductor 200 as shown in FIG. 2D, most of the implanted (damaged) area is removed.

FIG. 2E shows the semiconductor substrate 200 after the structured trench etch hard mask 202 is removed from the first main surface 204 of the substrate 200, and after the protection layer or stack of protection layers 210 if removed from the gate trenches 208. The protection layer or stack of protection layers 210 is removed from the gate trenches 208 after the doped region 216 is formed. Any standard removal process such as etching may be used to remove the structured trench etch hard mask 202 from the first main surface 204 of the substrate 200, and to remove the protection layer or stack of protection layers 210 from the gate trenches 208.

Figure 3:
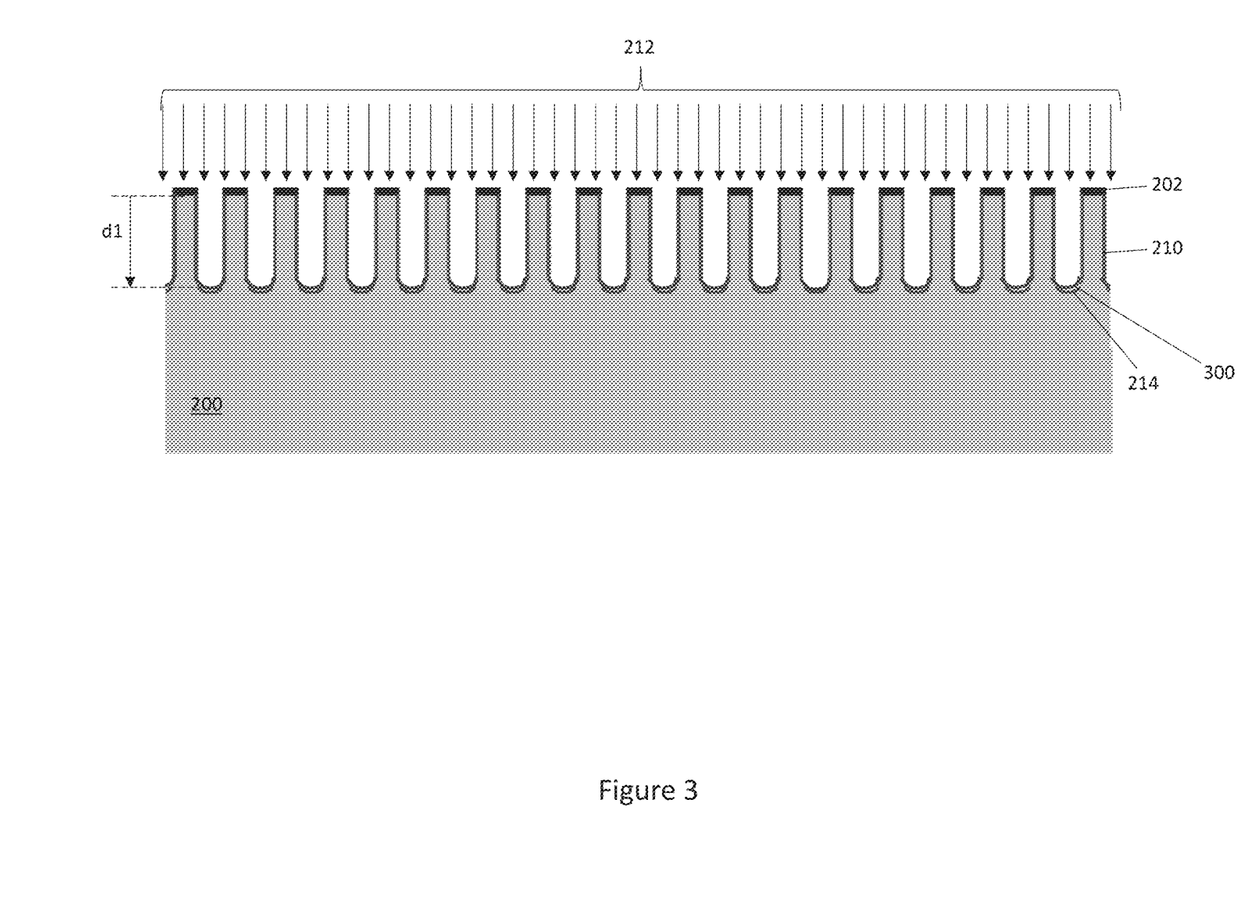
FIG. 3, FIG. 4, and FIGS. 5A and 5B illustrate respective partial cross-sectional views of the semiconductor substrate according to different embodiments of the method shown in FIG. 1.

The doped region 216 may or may not terminate within the semiconductor mesas 218 after etching to the second depth d2. For example, the doped region 216 may not terminate within the semiconductor mesas 218 if the second etching step and therefore d2-d1 is chosen to be relatively small. Also, after complete device processing, the doped region 216 may extend below the trenches 208 e.g. due to the thermal budget used in the device processing steps performed after the trench etch process. The barrier region extension below the trenches 208 may depend on other parameters such as the substrate base doping. The doping concentration of the doped region 216 extending below the trenches 208 may be kept low to avoid disadvantages related to the case of a high concentration barrier layer extension below the trenches 208, FIG. 3 illustrates another embodiment of forming the doped region 216 by ion implantation. The embodiment shown in FIG. 3 is similar to the embodiment shown in FIG. 2C. Different, however, the protection layer or stack of protection layers 210 is not removed from the bottom of the gate trenches 208 at the first (intermediary) depth d1 to expose the trench bottoms prior to implantation. The dopant species 212 is implanted into the trench bottoms through the lower part 300 of the protection layer or stack of protection layers 210 which remains in place at the bottom (and sidewalls) of the gate trenches 208 during the ion implantation process. Processing may continue as previously described herein, e.g. by diffusing and activating the implanted dopant species (e.g. by annealing) as shown in FIG. 2D and then etching the gate trenches 208 deeper into the semiconductor substrate 200 to a final (second) depth d2 as shown in FIG. 2E.

Figure 4:
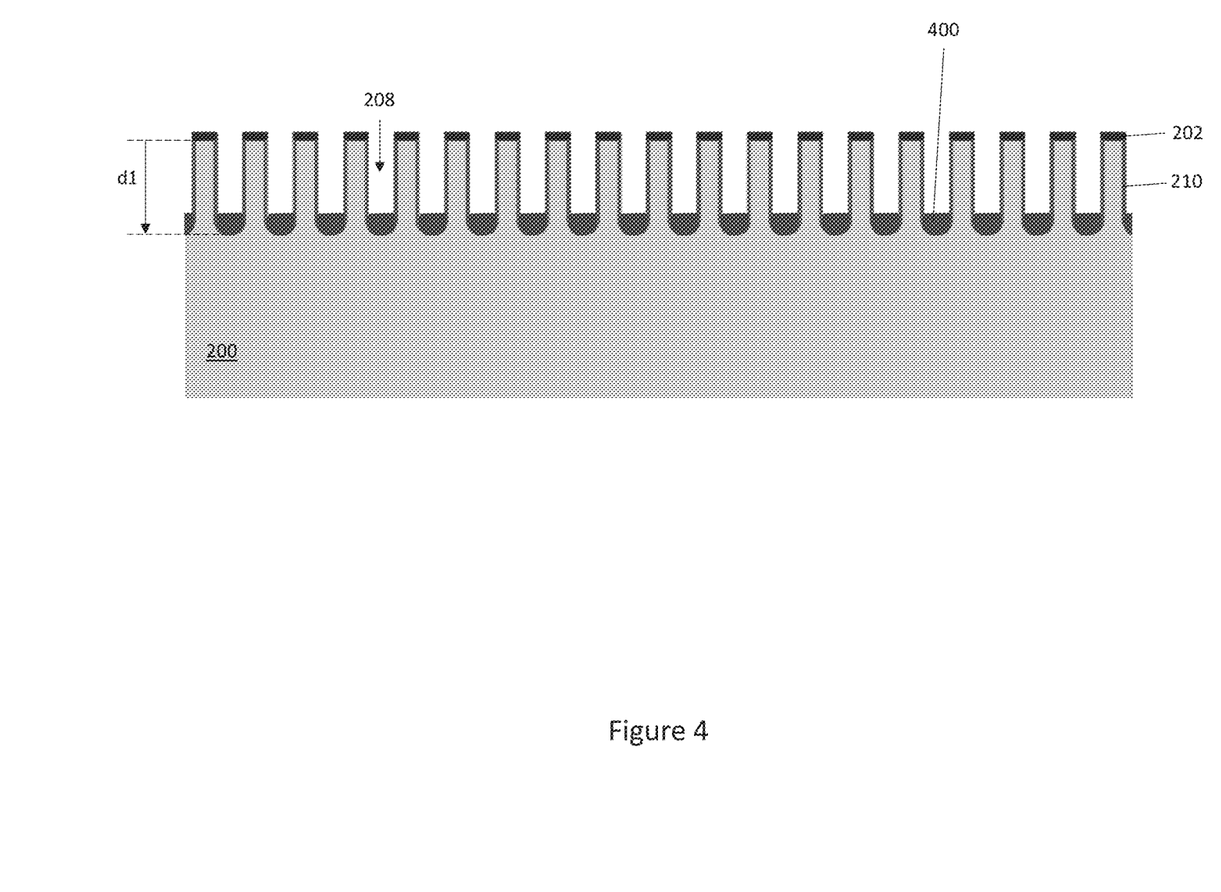

FIG. 4 illustrates an embodiment of forming the doped region 216 by diffusion instead of ion implantation. According to this embodiment, the protection layer or stack of protection layers 210 is removed from the bottom of the trenches 208 at the first (intermediary) depth d1 to expose the trench bottoms, e.g., as previously described herein in connection with FIG. 2B. A dopant source material 400 is then deposited on the exposed trench bottoms. Dopant atoms contained in the dopant source material 400 diffuse into the region of the semiconductor substrate 200 surrounding the bottom of the trenches 208 at the first (intermediary) depth d1. The dopant source material 400 may be in gaseous form, solid form and/or liquid form. For example, in the case of a Si substrate, common n-type gas phase sources include arsine and phosphine, common p-type gas sources include diborane and boron trichloride, a common n-type liquid phase source includes phosphorous oxychloride, a common p-type gas liquid source includes boron tribromide, common n-type solid phase sources include antimony trioxide, arsenic trioxide include phosphorous pentoxide, and common p-type solid sources include boron trioxide and boron nitride. Still other substrate and dopant source material types are contemplated and within the scope of the embodiments described herein. A dedicated annealing step may not be necessary for activating the diffused dopants to form the doped region 216. Depending on the conditions of the diffusion process, enough dopants may diffuse from the dopant source material 400 into the surrounding semiconductor material and activate to form the doped region 216 without requiring a dedicated annealing step. At least some of the diffused dopants may activate during subsequent annealing performed during later processing to activate dopants in other regions of the semiconductor device (e.g. body region dopants, emitter dopants, etc.).

Figure 5A:
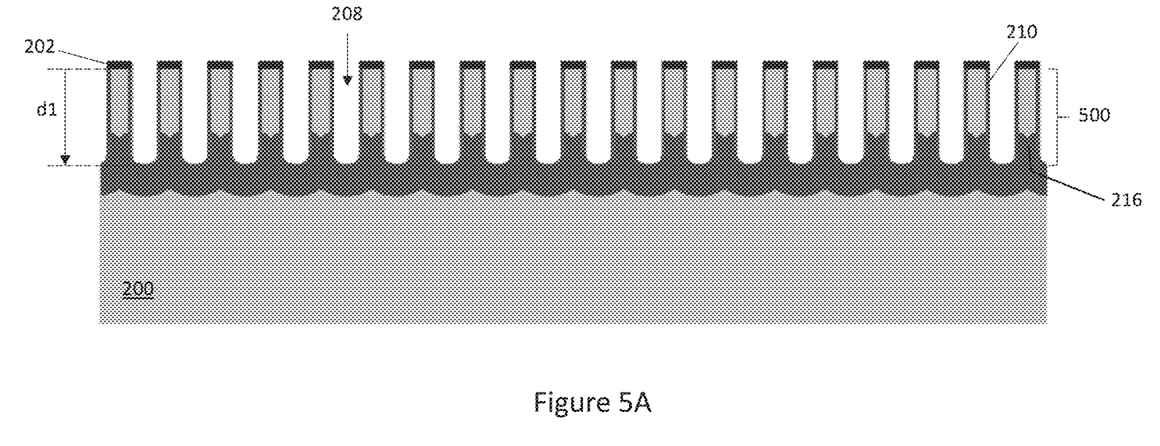
Figure 5B:
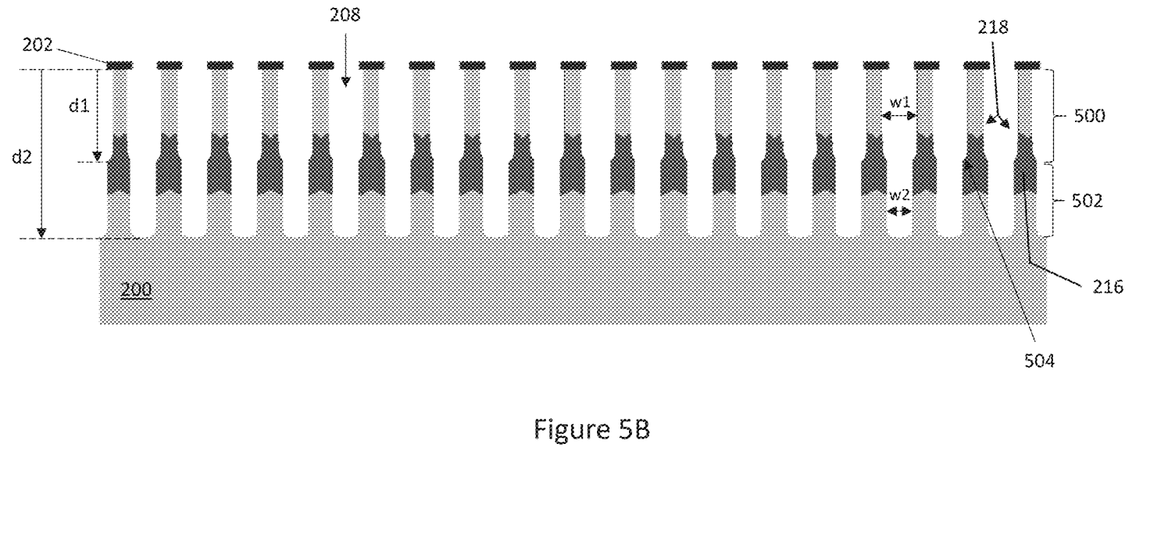

FIGS. 5A and 5B show another embodiment of etching the gate trenches 208 deeper into the semiconductor substrate 200 to a second (final) depth d2 greater than the first (intermediary) depth d1 after the doped region 216 is formed. The embodiment shown in FIGS. 5A and 5B is similar to the embodiment shown in FIG. 2E. Different, however, the protection layer or stack of protection layers 210 is removed from the gate trenches 208 after the gate trenches 208 are etched deeper into the semiconductor substrate 200 to the second (final) depth d2. Depending on the processing details, other trench shapes than what are shown are possible such as, for example, bottle-shaped trenches.

FIG. 5A shows the gate trenches 208 at the first (intermediary) depth d1 after the doped region is formed 216. The protection layer or stack of protection layers 210 remains at least on the sidewalls of the gate trenches 208 as the second (deeper) gate trench etching process begins. Since the protection layer or stack of protection layers 210 remains on the upper part 500 of the gate trench sidewalls during the second (deeper) gate trench etching process, the bottom part 502 of the gate trenches 208 is narrower than the upper part 500 (w2<w1).

FIG. 5B shows the semiconductor substrate 200 after the gate trenches 208 are etched to the second (final) depth d2, and after the protection layer or stack of protection layers 210 is removed from the gate trenches 208. A step 504 is present at the first (intermediary) depth d1 between the upper (wider) part 500 of the gate trenches 208 and the lower (narrower) part 502 of the gate trenches 208, according to this embodiment. Any standard removal process such as etching may be used to remove the protection layer or stack of protection layers 210 from the gate trenches 208 after the gate trenches 208 are etched deeper into the semiconductor substrate 200 to the second (final) depth d2.

Standard device processes to complete the semiconductor device are performed after the gate trenches 208 are etched to their final (second) depth d2. For example, such processes may include gate dielectric and gate electrode (and possibly field electrode) formation in the gate trenches 208, formation of the body region, formation of other active device regions such as source/emitter/collector/drain, etc., formation of interlayer dielectrics, formation of contacts to the active device regions, metallization, etc. The type and extent of processing performed after the gate trenches 208 are etched to their final (second) depth d2 depends on the type of semiconductor device being manufactured, and is not described herein in detail since such processing is well known and does not require further explanation to aid in understanding the potential barrier embodiments described herein.

Figure 6:
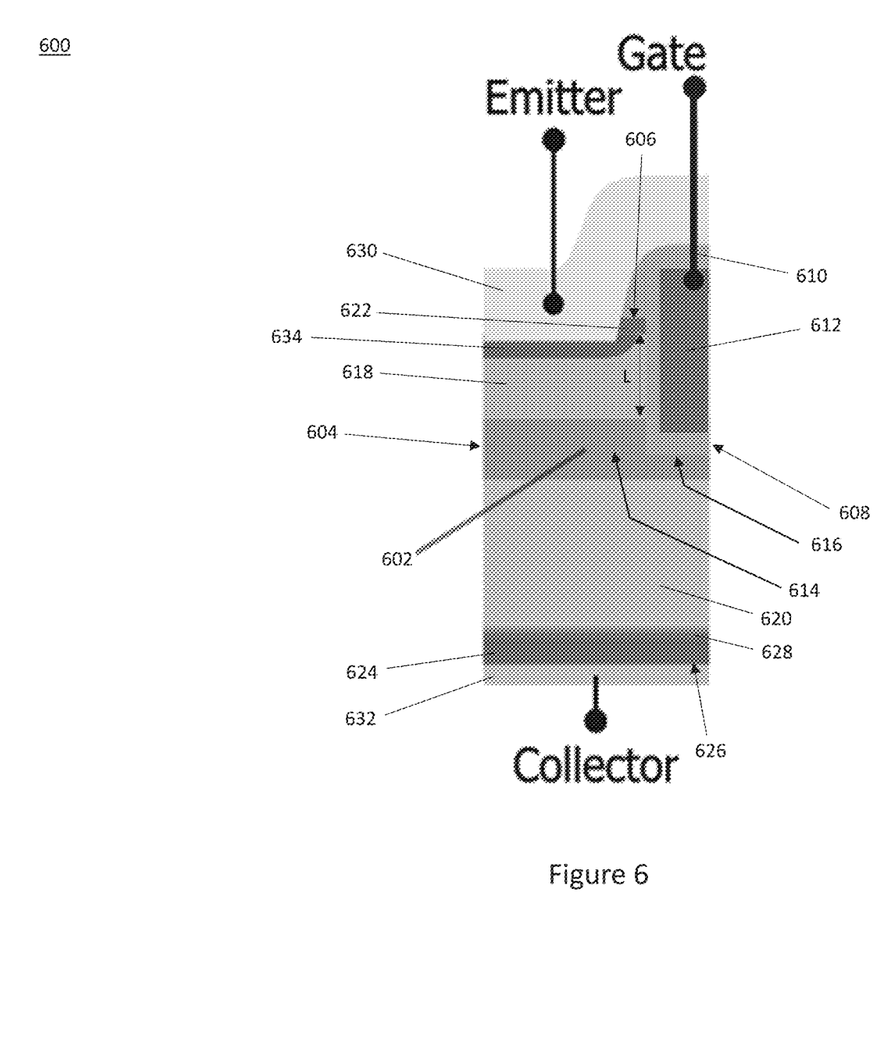
FIG. 6 illustrates a partial cross-sectional view of an embodiment of a semiconductor device manufactured in accordance with the method shown in FIG. 1.

FIG. 6 illustrates a partial cross-sectional view of an exemplary IGBT semiconductor device 600 with a hole or electron potential barrier 602 formed according to the method illustrated in FIG. 1. The IGBT semiconductor device 600 includes a semiconductor substrate 604 having a first main surface 606. A plurality of gate trenches 608, one of which is shown in FIG. 2E, extends from the first main surface 606 into the semiconductor substrate 604. A gate dielectric 610 and a gate electrode 612 are formed in the gate trenches 608. The gate dielectric 610 insulates the corresponding gate electrode 612 from the surrounding semiconductor substrate 604. Field electrodes may be formed in some or all of the gate trenches 608 below and insulated from the gate electrodes 612, and/or in separate trenches, but are not shown for ease of illustration.

Semiconductor mesas 614 are disposed between adjacent ones of the gate trenches 608. The hole or electron potential barrier 602 is formed in the semiconductor mesas 614 and may or may not terminate within the semiconductor mesas 614 before reaching the bottom 616 of the gate trenches 608. FIG. 6 shows the hole or electron potential barrier 602 extending deeper into the semiconductor substrate 604 than the gate trenches 608.

A body region 618 of the IGBT device 600 is formed above the hole or electron potential barrier 602 in the semiconductor mesas 614. The body region 618 may be formed before or after formation of the hole or electron potential barrier 602. The body region 618 may have the same or opposite conductivity type as the hole or electron potential barrier 602. For example, if the body region 618 is doped p-type, the hole or electron potential barrier 602 may be doped n-type and is a hole potential barrier. If the body region 618 is doped n-type, the hole or electron potential barrier 602 may be doped p-type and is an electron potential barrier. In other cases, barrier region 602 may comprise a p-type layer having a higher doping than the adjacent body region 618 and therefore function as a hole potential barrier. In one embodiment, the hole or electron potential barrier 602 has a peak doping concentration of at least $5\,E16\,cm^{-3}$. Such a doping concentration in the hole or electron potential barrier 602 may reduce VCEON.

The hole or electron potential barrier 602 is formed deep enough in the drift zone 620 of the IGBT device 600 to not adversely interfere with the length L of the body region 618, which defines the channel length of the device 600 and therefore determines susceptibility to short channel effects. The source region 622 of the IGBT device 600 is formed in the body region 618, and the collector region 624 is formed at the opposite main surface 626 of the semiconductor substrate 604. A field stop layer 628 may be provided between the collector region 624 and the drift zone 620 of the IGBT device 600. An emitter contact 630, a collector contact 632 and a gate contact (out of view in FIG. 6) are provided for connecting to the corresponding terminals of the IGBT device 600. A heavily p+ doped body contact region 634 may be provided between the emitter contact 630 and the body region 618 to prevent latchup.

A power MOSFET may be realized instead of an IGBT, by omitting region 624. Still other types of semiconductor devices may benefit from inclusion of the deep doped region described herein.

Figure 7:
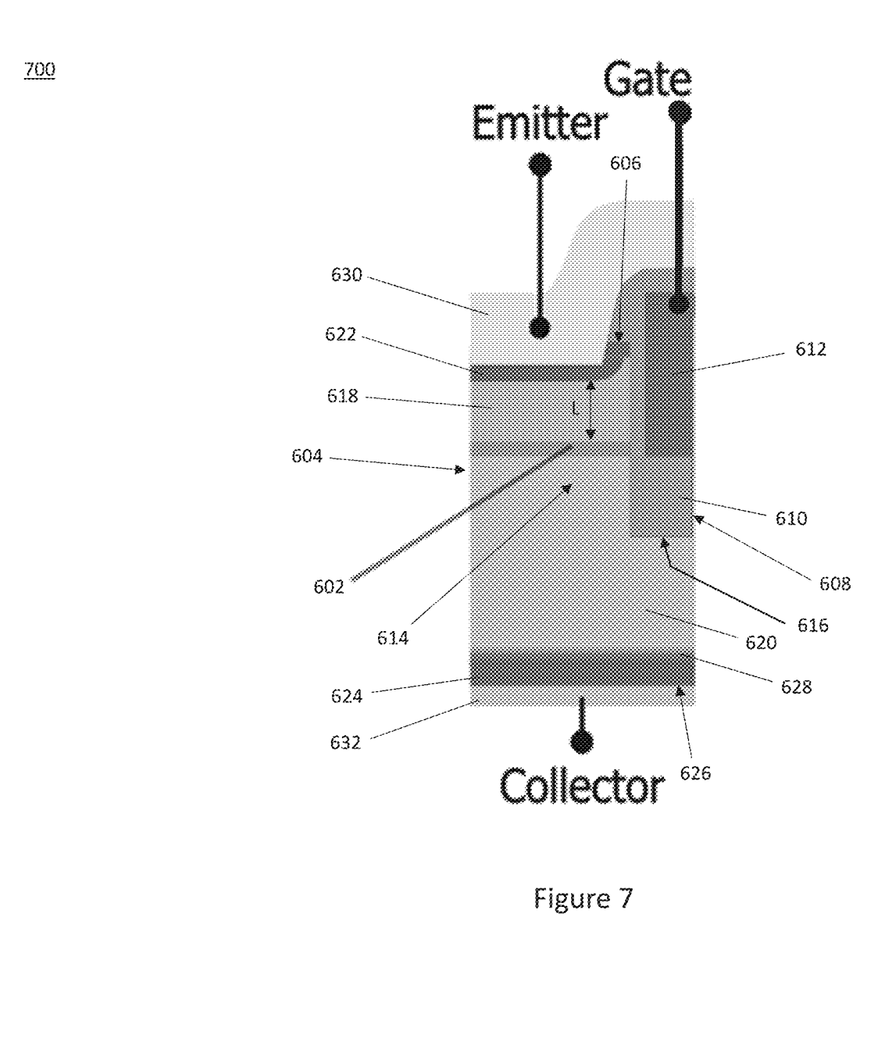
FIG. 7 illustrates a partial cross-sectional view of an embodiment of a semiconductor device manufactured in accordance with the method shown in FIG. 1.

FIG. 7 illustrates a partial cross-sectional view of another exemplary IGBT semiconductor device 700 with a hole or electron potential barrier 602 formed according to the method illustrated in FIG. 1. The embodiment shown in FIG. 7 is similar to the one shown in FIG. 6. Different, however, the hole or electron potential barrier 602 terminates within the semiconductor mesas 614 before reaching the bottom 616 of the gate trenches 608.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
    etching a plurality of trenches to a first depth in a semiconductor substrate by forming a structured trench etch hard mask on a first main surface of the semiconductor substrate and etching the plurality of trenches to the first depth in the semiconductor substrate through openings in the structured trench etch hard mask;

doping a region of the semiconductor substrate surrounding a bottom of the trenches at the first depth to form a doped region in the semiconductor substrate;

before the doped region is formed, forming a protection layer or stack of protection layers on sidewalls and the bottom of the trenches at the first depth, the protection layer or stack of protection layers being different than the structured trench etch hard mask to ensure later selective removal of the protection layer or stack of protection layers with respect to the structured trench etch hard mask;

after the doped region is formed, etching the plurality of trenches deeper into the semiconductor substrate to a second depth greater than the first depth, adjacent ones of the trenches being separated from one another by a semiconductor mesa;

selectively removing the protection layer or stack of protection layers with respect to the structured trench etch hard mask; and forming a body region above the doped region in the semiconductor mesas.

2. The method of claim 1, wherein the body region is doped p-type, and wherein the doped region is a hole potential barrier.

3. The method of claim 1, wherein the body region is doped n-type, and wherein the doped region is an electron potential barrier.

4. The method of claim 1, wherein forming the doped region comprises:
implanting a dopant species through the protection layer or stack of protection layers at the bottom of the trenches at the first depth; and
annealing the semiconductor substrate to diffuse and activate the implanted dopant species.

5. The method of claim 1, wherein forming the doped region comprises:
removing the protection layer or stack of protection layers from the bottom of the trenches at the first depth to expose the trench bottoms;
implanting a dopant species into the exposed trench bottoms; and
annealing the semiconductor substrate to diffuse and activate the implanted dopant species.

6. The method of claim 1, wherein forming the doped region comprises:
removing the protection layer or stack of protection layers from the bottom of the trenches at the first depth to expose the trench bottoms;
depositing a dopant source material on the exposed trench bottoms; and
diffusing a dopant species from the dopant source material and into the region of the semiconductor substrate surrounding the bottom of the trenches at the first depth.

7. The method of claim 1, further comprising:
after the doped region is formed, removing the protection layer or stack of protection layers from the trenches.

8. The method of claim 7, wherein the protection layer or stack of protection layers is removed from the trenches after etching the trenches deeper into the semiconductor substrate to the second depth, so that the sidewalls of the trenches have a step at the first depth.

9. The method of claim 1, wherein the protection layer or stack of protection layers comprises a silicon oxide layer.

10. The method of claim 1, wherein the protection layer or stack of protection layers comprises a silicon nitride layer.

11. The method of claim 1, wherein the protection layer or stack of protection layers comprises a stack of one or more silicon oxide layers and one or more silicon nitride layers.

12. The method of claim 1, wherein the doped region has a peak doping concentration of at least 5 E16 $cm^{-3}$.

13. The method of claim 1, further comprising:
after etching the plurality of trenches deeper into the semiconductor substrate to the second depth, forming a gate dielectric and a gate electrode in the trenches,
wherein the gate dielectric insulates the gate electrode from the surrounding semiconductor substrate.

14. A method of manufacturing a semiconductor device, the method comprising:
etching a trench to a first depth in a semiconductor substrate using a structured trench etch hard mask;
forming a protection layer or stack of protection layers on sidewalls and a bottom of the trench at the first depth, the protection layer or stack of protection layers being different than the structured trench etch hard mask to ensure later selective removal of the protection layer or stack of protection layers with respect to the structured trench etch hard mask;
doping a region of the semiconductor substrate surrounding a bottom of the trench at the first depth to form an n-type hole potential barrier;
after the n-type hole potential barrier is formed, etching the trench deeper into the semiconductor substrate to a second depth greater than the first depth; and
selectively removing the protection layer or stack of protection layers with respect to the structured trench etch hard mask.

15. The method of claim 14, further comprising:
before the n-type hole potential barrier is formed, forming a protection layer or stack of protection layers on sidewalls and the bottom of the trench at the first depth.

16. The method of claim 1, wherein the protection layer or stack of protection layers has a different quality than the structured trench etch hard mask to ensure later selective removal of the protection layer or stack of protection layers with respect to the structured trench etch hard mask.

17. The method of claim 1, wherein the protection layer or stack of protection layers has a different composition than the structured trench etch hard mask to ensure later selective removal of the protection layer or stack of protection layers with respect to the structured trench etch hard mask.

18. The method of claim 1, wherein the protection layer or stack of protection layers has a different quality and composition than the structured trench etch hard mask to ensure later selective removal of the protection layer or stack of protection layers with respect to the structured trench etch hard mask.

19. The method of claim 1, wherein selectively removing the protection layer or stack of protection layers with respect to the structured trench etch hard mask comprises selectively removing the protection layer or stack of protection layers with respect to the structured trench etch hard mask from the bottom of the trenches at the first depth to expose the trench bottoms.

* * * * *